United States Patent [19]
Okino

[11] Patent Number: 5,467,267
[45] Date of Patent: Nov. 14, 1995

[54] PROM BUILT-IN MICRO COMPUTER

[75] Inventor: Yasushi Okino, Tsuge, Japan

[73] Assignee: Sharp Kabushiki Kaisha, Osaka, Japan

[21] Appl. No.: 261,124

[22] Filed: Jun. 14, 1994

[30] Foreign Application Priority Data

Jun. 16, 1993 [JP] Japan .................................. 5-144697

[51] Int. Cl.⁶ .............................. G05B 9/02; G11C 11/34
[52] U.S. Cl. ........................... 364/184; 365/182; 365/174
[58] Field of Search ..................................... 364/184, 186;
371/40.2, 25.1; 324/537; 365/182, 189.05,
201, 174, 177

[56] References Cited

U.S. PATENT DOCUMENTS 5,142,541  8/1992  Kim et al. ............................. 371/40.2
5,384,732  1/1995  Nishimaki ............................. 365/185

FOREIGN PATENT DOCUMENTS 4-103096  4/1992  Japan .

Primary Examiner—Paul P. Gordon

[57] ABSTRACT

A PROM built-in micro computer has a semiconducting nonvolatile memory which can be written into electrically, and has a micro computer. It detects a semiconducting nonvolatile memory cell whose readout current is less than or equal to a constant value at a time of data comparison after a writing operation. The PROM built-in micro computer is adapted to prevent a readout error which may result from a fluctuation of temperature or supply voltage. This may be done by changing a reference potential at the time of a data comparison, by changing the sensitivity of a sense amplifier, or by changing a readout current or a threshold value of the PROM cell.

7 Claims, 7 Drawing Sheets

5,467,267

PROM BUILT-IN MICRO COMPUTER

BACKGROUND OF THE INVENTION

1. Field of the Invention

The present invention relates to a PROM built-in micro computer having a semiconducting nonvolatile memory which can be written electrical on a single chip, and having a micro computer.

2. Description of the Related Arts

The PROM built-in micro computer having the semi conducting nonvolatile memory which can be written electrically and the micro computer has been widely used in electrical apparatus including home electrically apparatuses.

Up to now, a readout margin has been reserved, by providing an operating supply voltage Vdd which is higher than a specified value at a time of a data comparison after a writing operation, in order to prevent a readout error resulting from a fluctuation of a supply voltage or a temperature in a micro computer having a semiconducting nonvolatile memory (hereafter called PROM) which can be written electrically.

The method uses a fact that the readout error does not appear if the Vdd is higher than the specified voltage (for example 6 V) in order to prevent the readout error within an operating temperature (for example −20° C. to 70° C.) in the specified voltage of the Vdd (for example 4.5 V to 5.5 V), based on a characteristics of a PROM cell. Then, in the method, it is possible to reserve the margin, if the Vdd is higher than the specified value, in a case where the Vdd is higher than a constant level. However, if the Vdd is reduced below the constant level, it is difficult to prevent the readout error resulting from a reduction of a readout current of the PROM cell.

Recently, there has been a problem of preventing the readout error in a case where the supply voltage is low, with relation to a reduction of the operating supply voltage of the micro computer in which the PROM built-in micro computer is built in.

In order to solve such a problem, for example, there is a method (Japanese Patent Application Laying Open (KOKAI) No. 4-103096) and the like of comparing a data in the PROM with a data in another memory which is insured to be operable until a low voltage, by reducing the operating supply voltage at the time of the data comparison.

In the prior art the readout error can not be prevented for the PROM built-in micro computer which is low in a supply voltage. In order to solve the problem, if a method is tried to compare a data in the PROM with another memory which is insured to be operable until a low voltage in the PROM, however, it is difficult to realize it by using a reference PROM writer because of a difficulty of a readout data processing. Therefore, in order to realize it, it is necessary to add a large circuit inside a LSI.

SUMMARY OF THE INVENTION

It is therefore an object of the present invention to provide a PROM built-in micro computer which can screen a readout error resulting from a fluctuation of a supply voltage or a temperature by solving the problem mentioned above and using a reference PROM writer.

According to the present invention, the above mentioned objects are attained by a PROM built-in micro computer comprising a semiconducting nonvolatile I memory which can be written electrically, and a micro computer, together on a single chip, the micro computer including:

a detecting means for detecting a semiconducting nonvolatile memory cell, a readout current of which is less than or equal to a constant value at a time of a data comparison after a writing operation, the PROM built-in micro computer being adapted to prevent a readout error resulting from a fluctuation of a temperature or a supply voltage of the micro computer building-in the semiconducting nonvolatile memory.

As mentioned above, the PROM built-in micro computer of the present invention comprises the detecting means for detecting the semiconducting nonvolatile memory cell having the readout current which is less than or equal to the constant value at the time of the data comparison after the writing operation, and is adapted to prevent the readout error resulting from the fluctuation of the supply voltage or the temperature of the whole micro computer in which the semiconducting nonvolatile memory that can be written electrically is built-in. Therefore, it is possible to make the screening of the readout error resulting from the fluctuation of the supply voltage or the temperature by using the reference PROM writer.

The micro computer may comprise a sense amplifier and a reference potential generating portion.

The detecting means may change a reference potential of the sense amplifier.

The detecting means may change a word line potential.

The detecting means may change a gate potential of a transistor which controls a bit line potential in the sense amplifier.

The detecting means may change an inverting threshold value of an inverter which detects a bit line data in the sense amplifier.

The detecting means may change a control gate potential of the semiconducting nonvolatile memory cell which can be written electrically.

Further objects and advantages of the present invention will be apparent from the following description of the preferred embodiments of the invention as illustrated in the accompanying drawings.

DESCRIPTION OF THE PREFERRED EMBODIMENTS

The preferred embodiments will be explained hereinafter with reference to the attached drawings.

Figure 1:
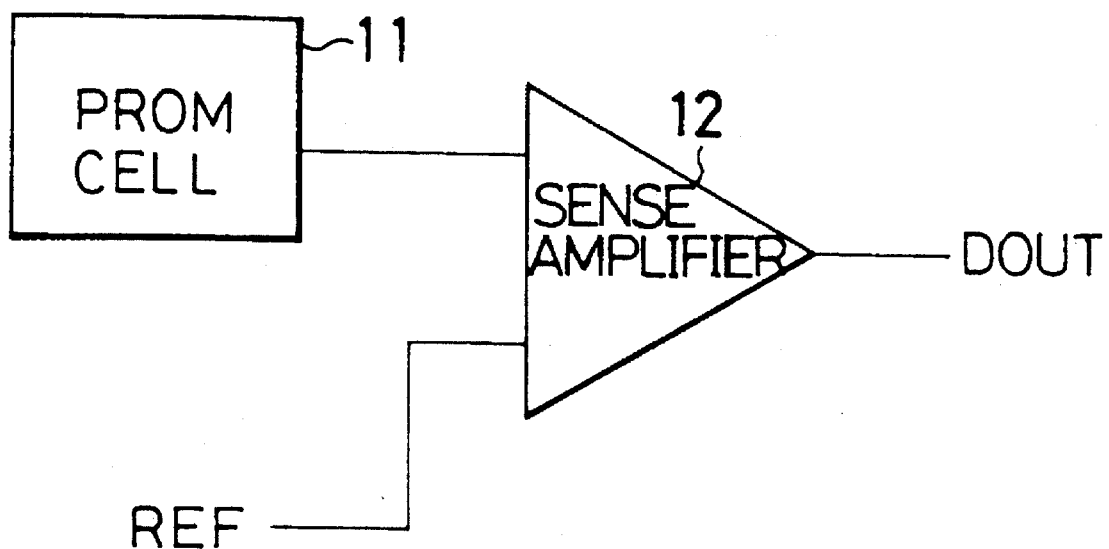
FIG. 1 is a schematic view of a PROM built-in micro computer according to the present invention.

FIG. 1 is a principle block diagram of the PROM built-in micro computer in accordance with the present invention.

The PROM built-in micro computer in accordance with the present invention comprises a PROM cell 11, and a sense amplifier 12 connected to an output of the PROM 11 at one end thereof and a reference potential REF at the other end thereof.

Only the PROM cell 11 having the readout current or the threshold value which is more than or equal to the constant value at the time of the data comparison after the writing operation is determined as an admitted item, by changing the reference potential REF at the time of the data comparison after the writing operation, by changing a sensing ability of the sense amplifier 12, or by changing the readout current or the threshold value of the PROM cell 11.

In a normal readout state, it is possible to read out even the PROM cell 11 having the readout current or the threshold value which is less than or equal to the constant value, by changing the reference potential REF, the sensing ability of the sense amplifier 12, or the readout current or the threshold value of the PROM cell 11, which was changed at the time of the data comparison after the writing operation.

The constant value which can be read out at the data comparison after the writing operation is set to a value of the readout current or the threshold value which can be read out at a time of a normal readout, plus a fluctuated value because of the fluctuation of the supply voltage of the PROM cell 11 or the temperature.

In the PROM cell 11 which is determined as the admitted item based on the means mentioned above, the readout current or the threshold value after the fluctuation is the value which can be read out in the sense amplifier 12, even if the readout current or the threshold value of the PROM cell 11 is fluctuated because of the fluctuation of the supply voltage or the temperature in the normal readout state.

The PROM cell 11 which can not be read out because of the fluctuation of the supply voltage or the temperature is determined as a defective item at the data comparison after the writing operation. Therefore, the readout error can be prevented resulting from the fluctuation of the supply voltage or the temperature.

Figure 2:
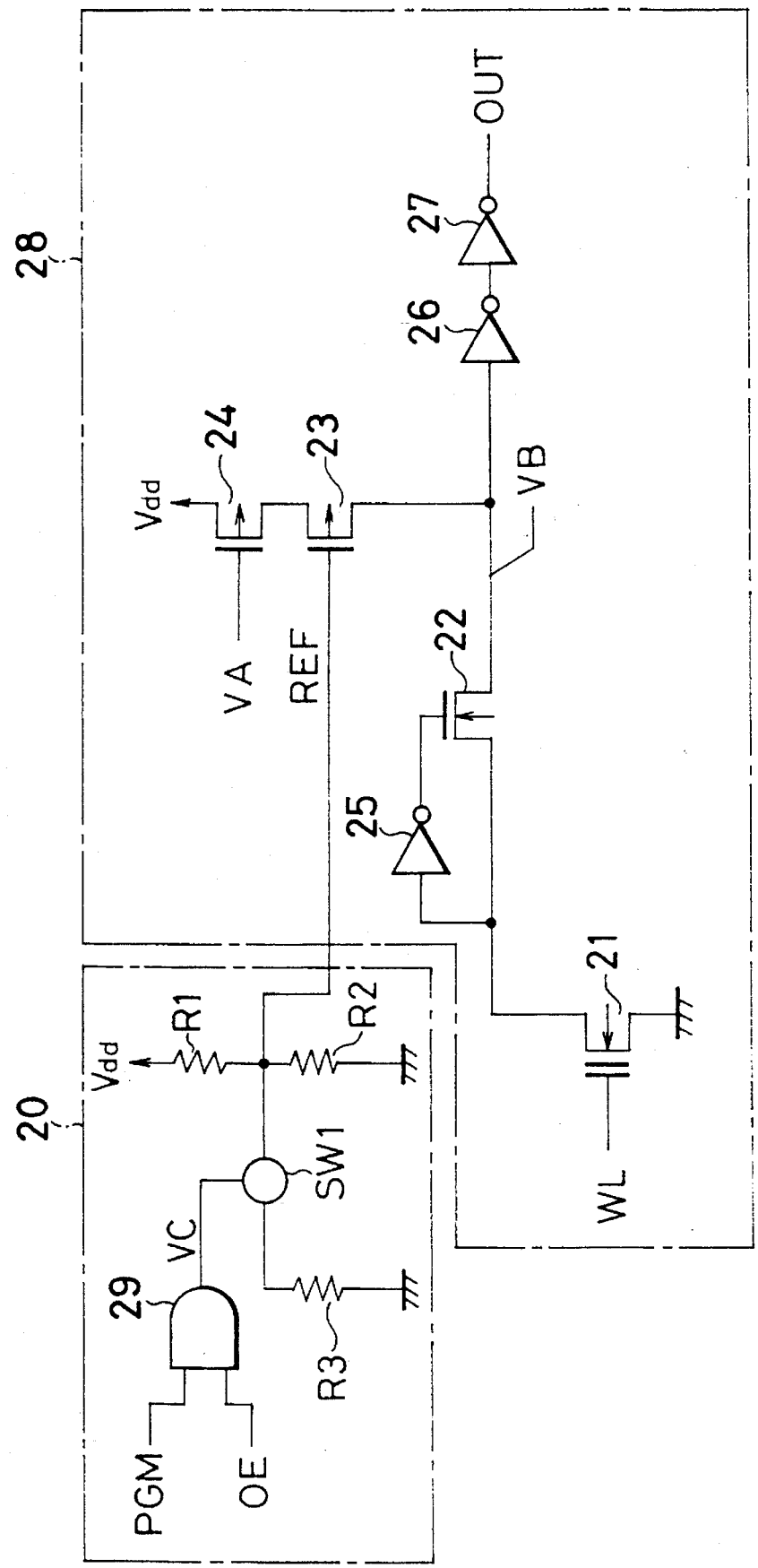
FIG. 2 is a circuit diagram illustrating one embodiment of a PROM built-in micro computer, wherein a reference potential of a sense amplifier according to the present invention is changed.

FIG. 2 is a circuit diagram illustrating an embodiment of a PROM built-in micro computer according to the present invention.

The PROM built-in micro computer according to the present invention is, for example, is used to read out a data in a PROM cell of the PROM built-in micro computer. An output signal OUT of the PROM cell is operated as a data in the PROM, for example, as a program code of the micro computer.

The PROM built-in micro computer of this embodiment comprises a sense amplifier 28 at a gate thereof and a reference potential generating block 20.

The sense amplifier 28 comprises a memory cell 21 is connected to a word line WL at a gate thereof, an inverter 25 connected to a drain of the memory cell 21 at an input thereof, a N channel transistor 22 connected to the drain of the memory cell 21 at a drain thereof and connected to an output of the inverter 25 at a gate thereof, respectively, a P channel transistor 23 connected to the source of the transistor 22 at a source thereof and connected to a reference potential REF at a gate thereof, respectively, a P channel transistor 24 connected to the drain of the transistor 23 at a source thereof, connected to a supply voltage Vdd at a drain thereof, and connected to a signal VA at a gate thereof, respectively, an inverter 26 connected to the source of the transistor 22 at an input thereof, and an inverter 27 connected to the output of the inverter 26 at an input thereof.

The reference potential generating block 20 comprises an AND gate 29 for receiving a signal PGM for a writing mode at one input thereof and a signal OE for indicating a readout state at the other end thereof, a switch SW1 connected to an output of the AND gate 29 for receiving an output signal Vc as a control input, a resistor R1 connected to one end of the switch SW1 at one end thereof and connected to the supply voltage Vdd at the other end thereof, a resistor R2 connected to the other end of the switch SW1, and connected to an earth at the other end thereof, and a resistor R3 connected to the other end of the switch SW1 and connected to the earth at the other end thereof.

The sense amplifier 28 is a current sensing type of the sense amplifier, and is used to read out the data in the memory cell 21. A signal WL is a word line. In a case where a memory cell 21 is selected, the signal WL becomes the logic "1".

In a case where the data in the memory cell 21 is the logic "1", even if the signal WL becomes the logic "1", the memory cell 21 does not become a conducting state. In a case where the data in the memory cell 21 is the logic "0", if the signal WL becomes "1", the memory cell 21 becomes the conducting state. The signal VA controls an operation of the sense amplifier 28. If the signal VA is the logic "0", the sense amplifier 28 is operated. If the signal VA is the logic "1", the sense amplifier 28 is not operated. The signal REF is the reference potential of the sense amplifier 28.

At a time of a readout state, the signal WL is the logic "1" and the signal VA is the logic "0". In a case where the data in the memory cell 21 is the logic "1", the memory cell 21 is not conducted. Thereby, a node VB is charged up to a level of the supply voltage Vdd through the transistors 23 and 24. The level of the node VB is detected by the inverters 26 and 27, and is outputted as the signal OUT.

In a case where the data in the memory cell 21 is the logic "0", the memory cell 21 is conductive. Thereby, a current flows from the transistor 24 through the transistors 23 and 22 to the memory cell 21. The level of the node VB is a value divided by inner resistances of the transistors 24, 23 and 22 and the memory cell 21. Dimensions of the transistors 24, 23 and 22 and the value of the reference potential REF are defined in such a manner that the divided voltage does not exceed an inverting threshold value of the inverter 26. The inverter 25 is used to control the inner resistance of the transistor 22 or the threshold value. Generally, the voltage applied to a drain of the memory cell 21 is limited (for example 3 V). Therefore, the inner resistance of the transistor 22 or the threshold value is controlled by using the output of the inverter 25. Thereby, the voltage of the drain of the memory cell 21 is prevented from increasing.

At the normal readout state, the reference potential REF of the sense amplifier 28 is the value divided by the resistors R1 and R2. The values of the resistors R1 and R2 are determined in such a manner that a sensing ability of the sense amplifier 28 is optimized.

The signal PGM is the signal indicating the writing mode. The signal OE is the signal indicating the readout state. In the data comparison state after the writing operation, the signal PGM is the logic "1", the signal OE is the logic "1", and the output VC of the AND gate 29 is the logic "1". In this state, the switch SW1 is turned on. Then, the reference potential REF is the value divided by the values of the resistors R1, R2 and R3. Therefore, the reference potential REF is lower compared with the value divided by the values of the resistors R1 and R2. The reference potential REF is defined in such a manner that the sensibility of the sense amplifier 28 is optimized when the reference potential REF is divided by the resistors R1 and R2. Thereby, the sensibility of the sense amplifier 28 is lower on the data comparison state after the writing operation than the normal readout state. The current of the memory cell 21 detected by the sense amplifier 28 is determined, based on the level of the reference potential REF. Thereby, it is possible to determine the readout current of the memory cell 21 be detected by the sense amplifier 28 based on the value of the resistor R3. On the other hand, the fluctuation of the readout current of the memory cell 21 with relation to the fluctuation of the supply voltage or the temperature can be known based on the characteristics of the memory cell 21.

Figure 3:
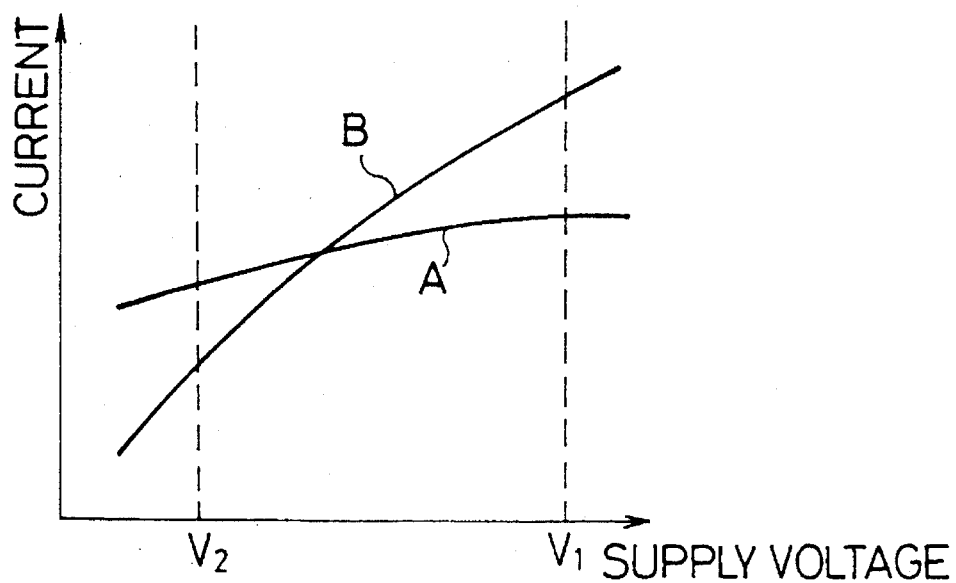
FIG. 3 is a schematic graph of a minimum value current which can be read out in a sense amplifier 28 with respect to a supply voltage Vdd, and of a readout current of a PROM cell 21 after writing a data with respect to a supply voltage Vdd.

FIG. 3 schematically shows a minimum value of the current which can be read out in the sense amplifier 28 with respect to the supply voltage Vdd in a case where the sensibility of the sense amplifier 28 is at maximum, and the readout current of the PROM cell 21 with respect to the supply voltage Vdd after the data of the logic "0" is written to the PROM cell 21. A solid line A indicates a minimum readout current which can be read out in the sense amplifier 28. A solid line B indicates the readout current in the PROM cell 21. A dotted line V1 indicates the supply voltage at the time of the data comparison after the write operation with a PROM writer (for example 6 V). A dotted line V2 indicates a minimum operating supply voltage in the PROM built-in micro computer as a whole (for example 2 V). The sense amplifier 28 can read out the data of the logic "0" written in the PROM cell 21 in a case where the readout current of the PROM cell 21 is greater than the minimum current which can be read out in the sense amplifier 28. It is easily understood in FIG. 3 that, while the logic "0" can be read out at the state in the supply voltage V1, it can not be read out at the state in the supply voltage V2.

Figure 4:
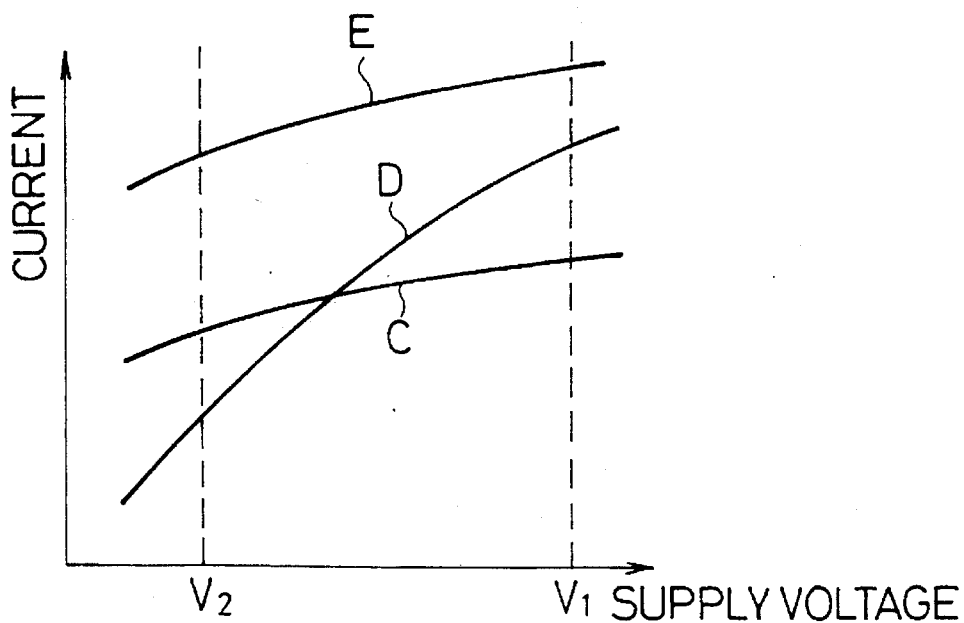
FIG. 4 is a schematic diagram of a minimum value of a current which can be read out in a sense amplifier 28 in a normal readout state with respect to a supply voltage Vdd, of a minimum value of the current which can be read out in the sense amplifier 28 at a time of a data comparison after a writing operation with respect to the supply voltage Vdd, and of readout current of a PROM cell 21 after writing the data of a logic "0" with respect to the supply voltage Vdd, in a case where the present invention is performed.

FIG. 4 shows a graph in case where this embodiment is applied. A solid line C indicates the minimum readout current which can be read out in the sense amplifier 28 at the time of the normal readout. A solid line D indicates the readout current of the PROM cell 21. A solid line E indicates the minimum readout current which can be read out in the sense amplifier 28 at the time of the data comparison after the writing operation. A dotted line V1 indicates the supply voltage at the time of the data comparison after the writing operation with the PROM writer. A dotted line V2 indicates the minimum operating supply voltage in the PROM built-in micro computer as a whole.

It is easily understood in FIG. 4 that the PROM cell 21 which can not be read out in the supply voltage V2 at the time of the normal readout is determined as a defective item at the time of the data comparison after the writing operation.

In this way, according to this embodiment, in the case of the normal readout, the PROM cell 21 which can not be read out because of a decrease of the supply voltage can be detected at the time of the data comparison after the writing operation.

In the description of the sense amplifier 28 mentioned above, the reference potential of the sense amplifier 28 is adapted to be changed, in order to relatively reduce the sensibility of the sense amplifier 28 compared with the normal readout, at the time of the data comparison after the writing operation. However, an inverting threshold value of the inverter 25 or 26 may be changed instead of the reference potential.

Figure 5:
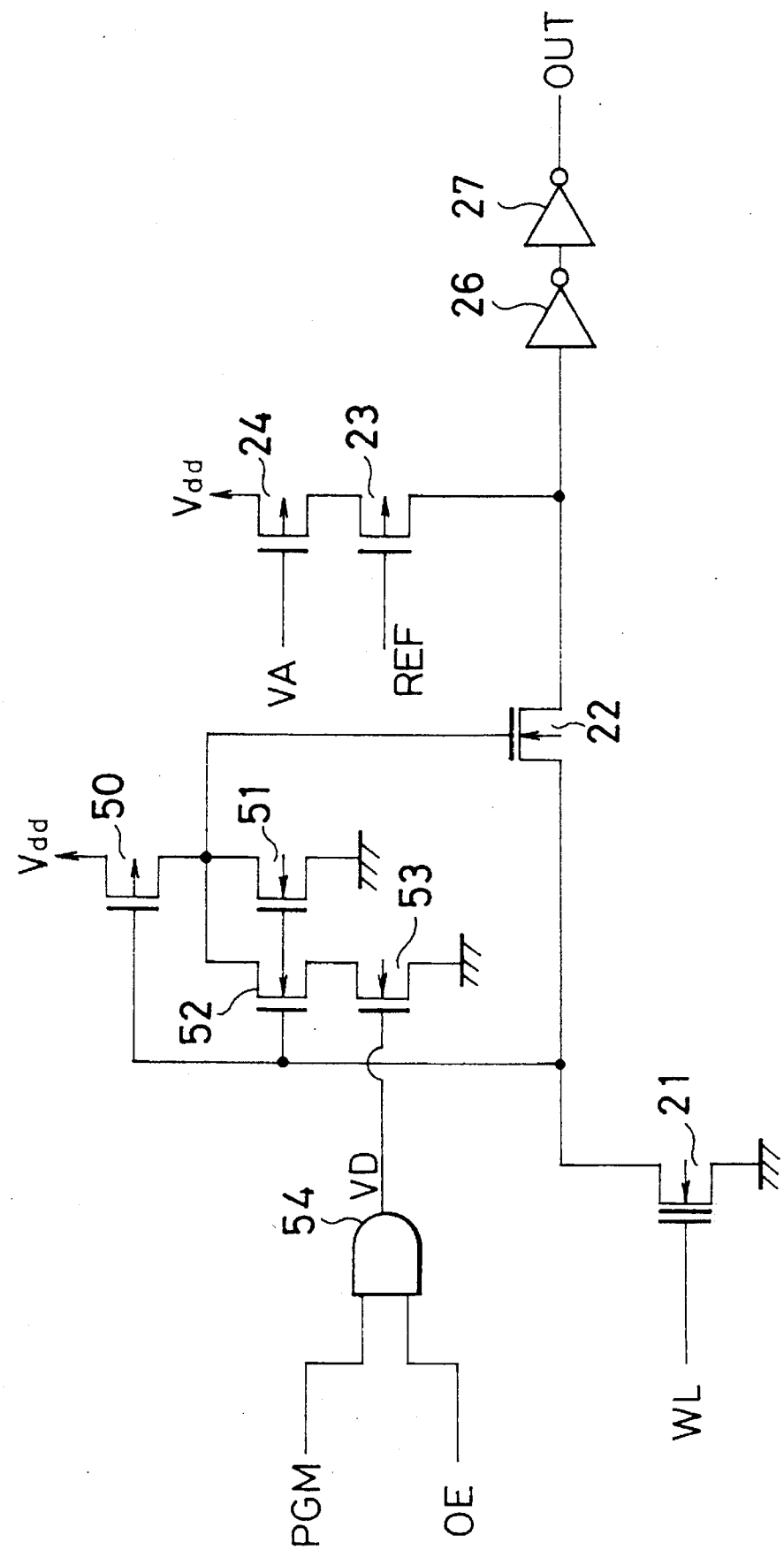
FIG. 5 is a circuit diagram illustrating another embodiment of a PROM built-in micro computer, wherein a gate potential of a transistor controlling a bit line potential is changed in a sense amplifier according to the present invention.

FIG. 5 shows a circuit diagram illustrating another embodiment of the PROM built-in micro computer, wherein the inverting threshold value of the inverter 25 shown in FIG. 2 is changeable and a gate potential of the transistor 22 controlling a bit line potential is changed.

In FIG. 5, a block in which the inverting threshold value of an inverter 25 is made changeable, comprises a P channel transistor 50 connected to a supply voltage Vdd at a drain thereof and connected to the drain of a transistor 22 at a gate thereof, respectively, a N channel transistor 51 connected to the source of the transistor 50 at a drain thereof, connected to the drain of the transistor 22 at a gate thereof and connected to an earth at a source thereof, respectively, a N channel transistor 52 connected to the source of the transistor 50 at a drain thereof and connected to the drain of the transistor 22 at a gate thereof, respectively, an AND gate 54 for receiving the signal PGM at one input thereof and the signal OE at the other end thereof, and a N channel transistor 53 connected to the source of the transistor 52 at a drain thereof, connected to an output VD of the AND gate 54 at a gate thereof and connected to an earth at a source thereof, respectively.

In this case, only in the data comparison state after the writing operation, if the output VD of the AND gate 54 is the logic "1" and the transistor 53 is turned on, an apparent threshold value of a MOS transistor 22 is increased. Thereby, the sensibility of the sense amplifier 28 is adapted to be relatively decreased on the data comparison state after the writing operation compared with on the normal readout state.

Figure 6:
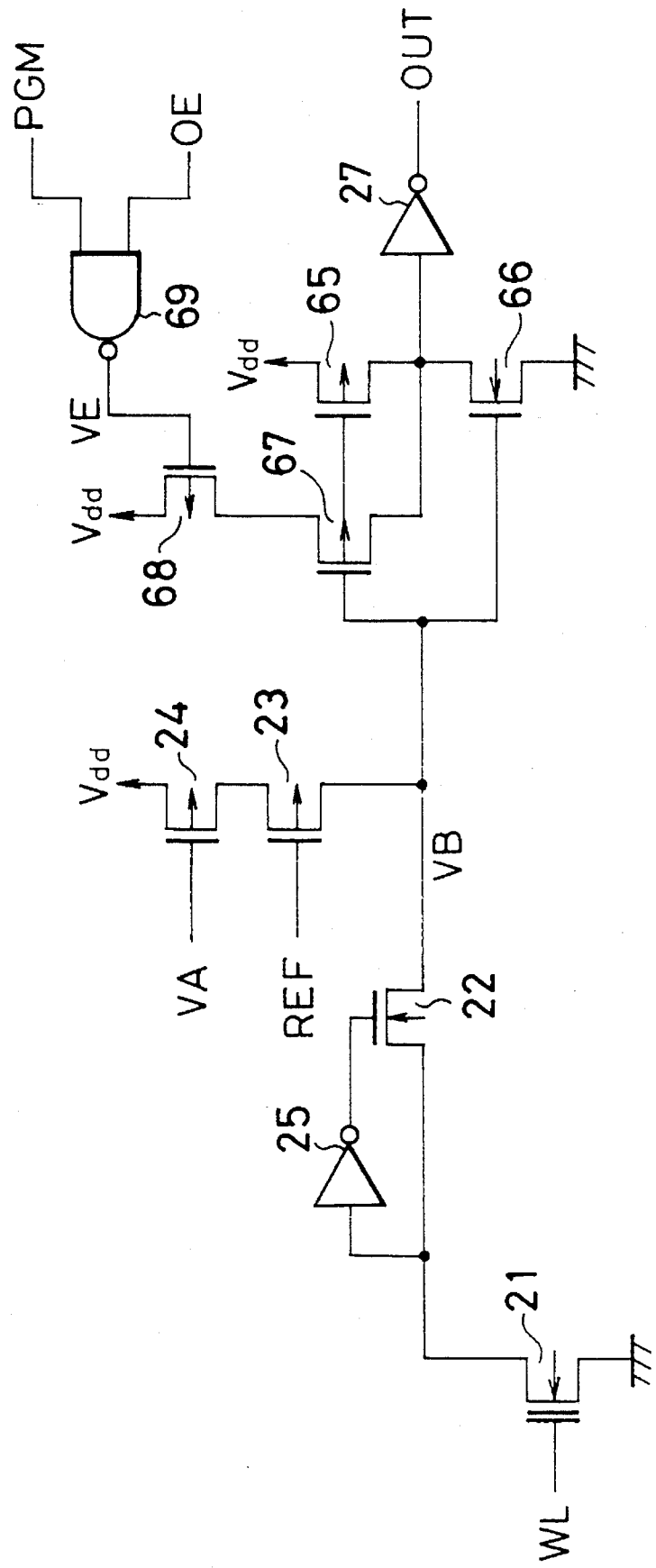
FIG. 6 is a circuit diagram illustrating further embodiment of a PROM built-in micro computer, wherein an inverting threshold value of an inverter for detecting a bit line data in a sense amplifier according to the present invention is changed.

FIG. 6 shows a circuit diagram illustrating further embodiment of the PROM built-in micro computer, wherein the inverting threshold value of the inverter 26 detecting the bit line data shown in FIG. 2 is made changeable.

A block in which the inverting threshold value of the inverter 26 is made changeable comprises a NAND gate 69 for receiving the signal PGM at one input thereof and the signal OE at the other end thereof, a P channel transistor 68 connected to a supply voltage Vdd at a drain thereof and connected to an output VE of the NAND gate 69 at a gate thereof, respectively, a P channel transistor 67 connected to the source of the transistor 68 at a drain thereof and connected to the source of the transistor 22 at a gate thereof, respectively, a P channel transistor 65 connected to the supply voltage Vdd at a drain thereof, connected to the source of the transistor 22 at a gate thereof and connected to the source of the transistor 67 at a source thereof, respectively, a N channel transistor 66 connected to the source of the transistor 65 at a drain thereof, connected to the source of the transistor 22 at a gate thereof and connected to an earth at a source thereof, respectively, and an inverter 27 connected to the source of the transistor 65 at an input thereof.

In this case, only in the data comparison state after the writing operation, if the output VE of the NAND gate 69 is the logic "0" and the transistor 68 is turned on, unless the level of the VB is lower on the data comparison state after the writing operation than the normal readout state, the logic "0" of the PROM cell 21 can not be read out. Therefore, the sensibility of the sense amplifier 28 is adapted to be relatively lower on the data comparison state after the writing operation than the normal readout state.

At the time of the data comparison after the writing operation mentioned above, the sensibility of the sense amplifier 28 is adapted to be changed in order to detect the PROM cell 21 of the readout current which is less than or equal to the constant current. However, the readout current of the PROM cell 21 itself may be made less, instead of changing the sensibility of the sense amplifier 28.

Figure 7:
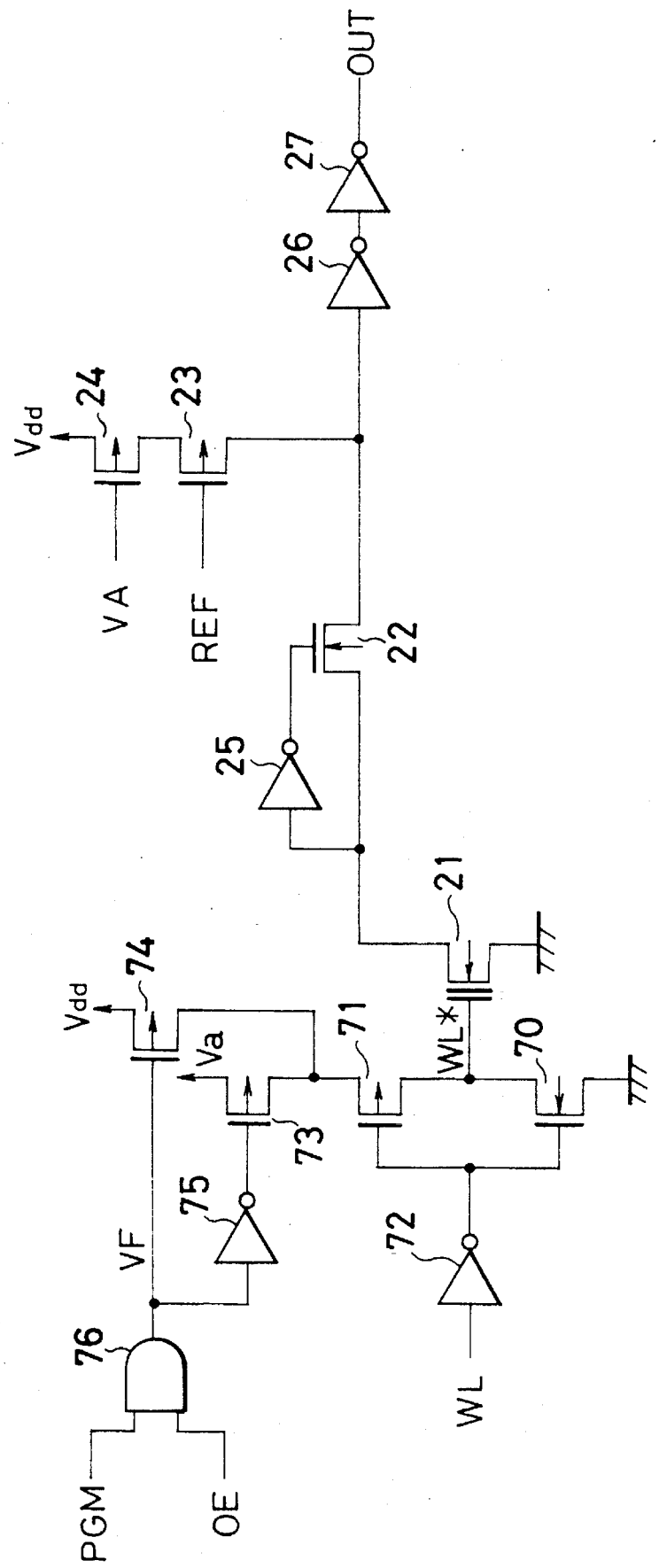
FIG. 7 is a circuit diagram illustrating still further embodiment of a PROM built-in micro computer, wherein a potential of a word line according to the present invention is changed.

FIG. 7 shows a circuit diagram illustrating still further embodiment of the PROM built-in micro computer, wherein the potential of a word line inputted into a memory cell 21 is adapted to be lower than the level of a supply voltage Vdd at the time of the data comparison after the writing operation.

A block in which the potential of the word line may be lower than the supply voltage Vdd comprises a NAND gate 76 for receiving the signal PGM at one end thereof and the signal OE at the other end thereof, a P channel transistor 74 connected to an output VF of the NAND gate 76 at a gate thereof and connected to the supply voltage Vdd at a drain thereof, respectively, an inverter 75 connected to the output VF of the NAND gate 76 at an input thereof, a P channel transistor 73 connected to a supply voltage Va at a drain thereof, connected to the output of the inverter 75 at a gate thereof and connected to the source of the transistor 74 at a source thereof, respectively, an inverter 72 connected to the signal WL at an input thereof, a P channel transistor 71 connected to the source of the transistor 74 at a drain thereof and connected to the output of the inverter 72 at a gate thereof, respectively, and a N channel transistor 70 connected to the source of the transistor 71 at a drain thereof, connected to the output of the inverter 72 at a gate thereof and connected to an earth at a source thereof, respectively.

In this case, only in the data comparison state after the writing operation, if the output VF of the AND gate 76 is the logic "1" and the output of the inverter 75 is the logic "0", the transistor 74 is turned off and the transistor 73 is turned on. In this way, in the data comparison state after the writing operation, the supply voltage Va is inputted to the source of the transistor 71.

The supply voltage Va is set to a value lower than the supply voltage Vdd. Therefore, when the word line WL is the logic "1", the word line WL is the voltage Va lower than the supply voltage Vdd as a signal WL* through the inverter 72 and the transistor 71, and is inputted into the memory cell 21.

In the normal readout state, if the output VF of the AND gate 76 is the logic "0" and the output of the inverter 75 is the logic "1", the transistor 74 is turned on and the transistor 73 is turned off. In this way, in the normal readout state, the supply voltage Vdd is inputted into the source of the transistor 71. Therefore, when the word line WL is the logic "1", the word line WL is the voltage Vdd as the signal WL* through the inverter 72 and the transistor 71, and is inputted into the memory cell 21.

It is evident from a basic operation of the transistor that in the memory cell 21, if a gate voltage becomes low, the readout current becomes small. In this way, the readout current is lower on the data comparison state after the writing operation than the normal readout state. The value of the Va is defined in such a manner that a reduction of the readout current corresponds to the value fluctuated, based on the supply voltage or a temperature.

Therefore, it is insured that the PROM cell 21 which is determined as an admitted item at the time of the data comparison after the writing operation, in the normal readout state, does not result in a readout error due to the fluctuation of the supply voltage or the temperature.

In a case where the memory cell 21 is an EEPROM, it is possible to change a reference potential CGREF of a control gate, in addition to the means mentioned above.

Figure 8:
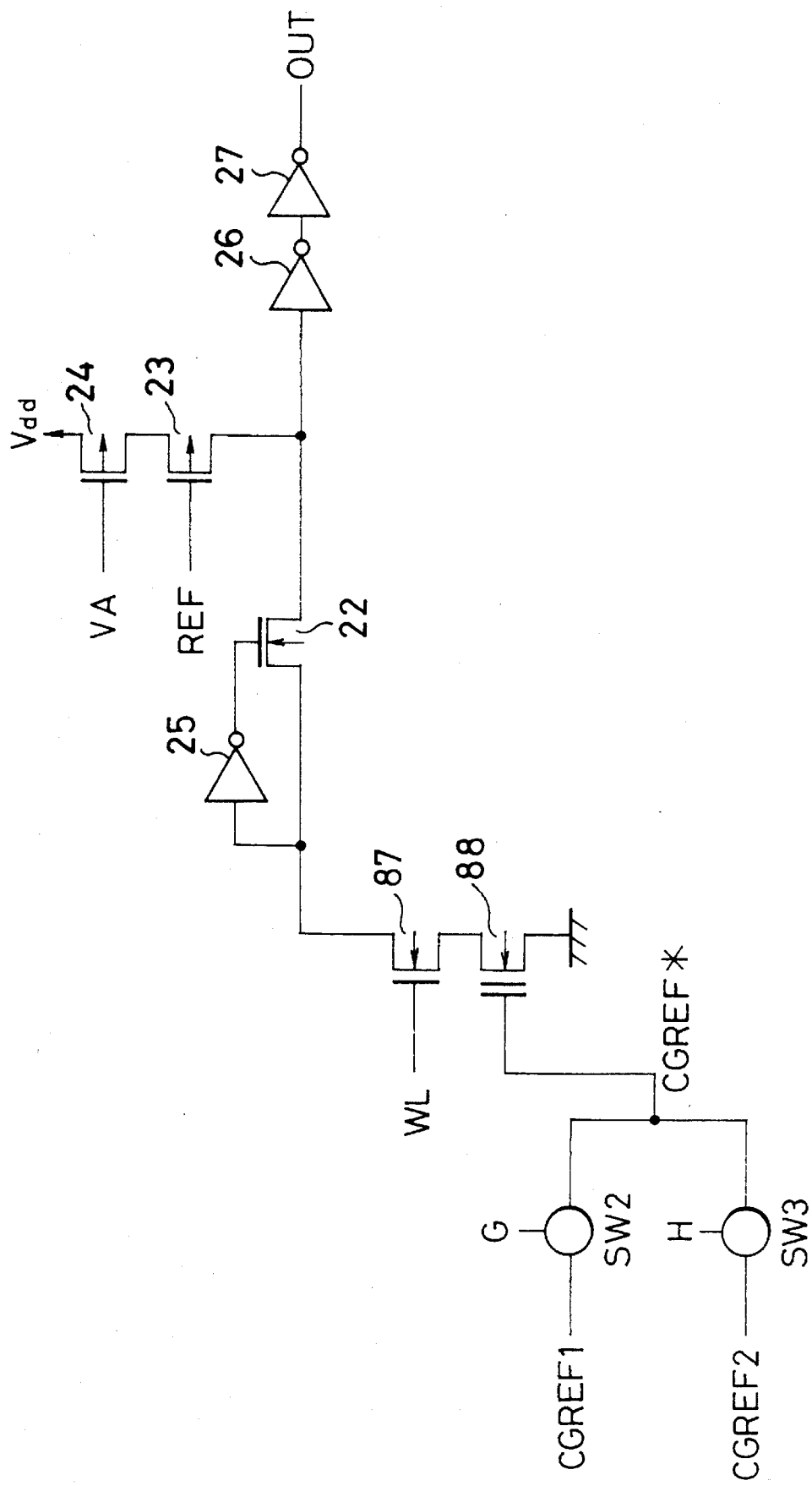
FIG. 8 is a circuit diagram illustrating still further embodiment of a PROM built-in micro computer, wherein a potential of a control gate of an EEPROM cell according to the present invention is changed.

FIG. 8 shows a circuit diagram illustrating still further one embodiment of the PROM built-in micro computer, wherein the reference potential is changed in a case where the memory cell 21 is the EEPROM.

A block in which the reference potential of the control gate is changed, comprises a switch SW2 having a control input G and supplying the reference potential to the control gate at the time of the normal readout, a switch SW3 having a control input H and supplying the reference potential to the control gate at the time of the data comparison after the writing operation, a control gate 88 receiving a reference potential CGREF* of the control gate, and a N channel transistor 87 connected to the signal WL at a drain thereof, connected to the drain of a transistor 22 and connected to the drain of a transistor 88 at a source thereof, respectively.

The transistor 87 is a memory cell selection transistor. The transistor 88 is the EEPROM cell. The CGREF* is the reference potential of the control gate. The signal G is the signal which is the logic "1" at the time of the normal readout, and is adapted to make the switch SW2 turned on. The signal H is the signal which is the logic "1" at the time of the data comparison after the writing operation and is adapted to make the switch SW3 turned on. The CGREF1 is set to an intermediate potential between the threshold value of the EEPROM cell when the logic "1" is written into the EEPROM cell and the threshold value when the logic "0" is written into the EEPROM cell.

In case of the EEPROM, there is a problem that the threshold value of the EEPROM cell is fluctuated because of the fluctuation of the supply voltage or the temperature. However, the threshold value of the EEPROM cell is a relative quantity to the reference potential CGREF. Thereby, it is possible to change the apparent threshold value of the EEPROM by changing the reference potential CGREF. The CGREF2 is set to the threshold value which is fluctuated, based on the supply voltage or the temperature at the time of the data comparison after the writing operation. Therefore, in the normal readout state, the CGREF1 is selected as the reference potential of the control gate. Also, the CGREF2 is selected in the data comparison state after the writing operation.

In this way, by changing the value of the CGREF, it is evident from the explanation mentioned above that the EEPROM cell which is determined as the admitted item at the time of the data comparison after the writing operation, in the normal readout state, results in the readout error because of the fluctuation of the supply voltage or the temperature.

It is easily understood that the readout error can be prevented even in the PROM built-in micro computer, an operating supply voltage of which is low because of such an effect. Furthermore, it may be easily understood that the readout error can be also prevented resulting from the temperature fluctuation.

Furthermore, in the present invention, there is no need of a high arithmetic processing and a complex processing, inside. Thereby, it is possible to perform the writing and readout operation by means of the reference PROM writer.

Furthermore, the embodiment is described by using a current sense type of a sense amplifier. However, it is not beyond the purpose of the present invention to use other method of realizing an equivalent function by means of a differential type of a sense amplifier.

As mentioned above, the PROM built-in micro computer according to the present invention changes the sensibility of the sense amplifier at the time of the data comparison after the writing operation, or changes the readout current or the threshold value of the PROM cell, and thereby detects the PROM cell which results in the readout error in a case where the operating supply voltage is low. Therefore, the readout error can be prevented, even in the PROM built-in micro computer whose operating supply voltage is low, by using the reference PROM writer.

Many widely different embodiments of the present invention may be constructed without departing from the spirit and scope of the present invention. It should be understood that the present invention is not limited to the specific embodiments described in the specification, except as defined in the appended claims.

What is claimed is:

1. A PROM built-in micro computer comprising:
    a semiconducting nonvolatile memory which can be written electrically, and a micro computer, together on a single chip, said micro computer including,
        detecting means for detecting a semiconducting nonvolatile memory cell, a readout current of which is less than or equal to a constant value at a time of a data comparison after a writing operation,
        said PROM built-in micro computer being adapted to prevent a readout error resulting from a fluctuation of a temperature or a supply voltage of said micro computer building-in said semiconducting nonvolatile memory.

2. A PROM built-in micro computer according to claim 1, wherein said micro computer comprises a sense amplifier and a reference potential generating portion.

3. A PROM built-in micro computer according to claim 2, wherein said detecting means changes a reference potential of said sense amplifier.

4. A PROM built-in micro computer according to claim 2, wherein said detecting means changes a word line potential of said sense amplifier.

5. A PROM built-in micro computer according to claim 2, wherein said detecting means changes a gate potential of a transistor controlling a bit line potential in said sense amplifier.

6. A PROM built-in micro computer according to claim 2, wherein said detecting means changes an inverting threshold value of an inverter detecting a bit line data in said sense amplifier.

7. A PROM built-in micro computer according to claim 2, wherein said detecting means changes a control gate potential of a semiconducting nonvolatile memory cell that can be written electrically.

* * * * *